(12) United States Patent
Lundgren

(10) Patent No.: US 9,704,741 B2
(45) Date of Patent: Jul. 11, 2017

(54) METHODS, ALGORITHMS AND SIGNAL PROCESSING MEANS UTILIZING THE HARBINGER WAVE TO FORECAST AND SIGNAL AN IMMINENT SHOCK WAVE AND DETERMINATION OF ITS VELOCITIES, PRESSURES, DENSITY AND EPICENTER

(71) Applicant: Ronald Gene Lundgren, Littleton, CO (US)

(72) Inventor: Ronald Gene Lundgren, Littleton, CO (US)

(*) Notice: Subject to any disclaimer, the term of this patent is extended or adjusted under 35 U.S.C. 154(b) by 60 days.

(21) Appl. No.: 14/846,803

(22) Filed: Sep. 6, 2015

(65) Prior Publication Data
US 2015/0369654 A1  Dec. 24, 2015

(51) Int. Cl.
*G01H 11/06* (2006.01)
*H01L 21/768* (2006.01)
(Continued)

(52) U.S. Cl.
CPC .......... *H01L 21/7682* (2013.01); *G01H 3/00* (2013.01); *G01H 11/00* (2013.01); *G01H 11/06* (2013.01);
(Continued)

(58) Field of Classification Search
CPC ............. H01L 21/682; H01L 21/31111; H01L 21/76807; H01L 21/76826; H01L 21/76834; H01L 21/76843; H01L 21/76877; H01L 21/7682; G01H 3/00; G01H 11/00; G01H 11/06; G01H 11/02; G01R 15/12; G01R 15/144; G01R 29/0814; G01R 21/00; G01R 21/02; G01F 25/00; G01L 27/00
See application file for complete search history.

(56) References Cited

U.S. PATENT DOCUMENTS 3,080,515 A  3/1963 Kehoe
3,214,615 A  10/1965 Way
(Continued)

OTHER PUBLICATIONS

16th Annual Independent Inventors Conference; Aug. 15-16, 2014; USPTO, Alexandria VA; Advanced Claim Drafting.*
(Continued)

*Primary Examiner* — Michael Zarroli

(57) ABSTRACT

Methods, algorithm and signal processing means utilizing an explosively formed Harbinger (H) wave to forecast an imminent shock wave and in conjunction with the this trailing Main (M) shock wave determination of H wave velocity and M shock wave velocities, overpressure, dynamic pressure, and density and further the M shock wave epicenter location co-ordinates. These parameter determinations are based on the discovery of a Harbinger wave launched upon formation of the M shock wave which annunciates the incoming M shock wave before its arrival. These variables are further used to devise methods and systems to simultaneously detonate an array of munitions, deploy just in time personnel and/or equipment protection, determine the wave epicenter for identifying enemy combatants and terrorist positions, alert response teams to a deleterious event and its magnitude, signal the location of these deleterious events and determine if a munition has functioned.

3 Claims, 6 Drawing Sheets

(51) Int. Cl.
   *G01H 3/00* (2006.01)
   *G01H 11/00* (2006.01)
   *H01L 21/311* (2006.01)
   *G01H 11/02* (2006.01)

(52) U.S. Cl.
   CPC .. *H01L 21/31111* (2013.01); *H01L 21/76807* (2013.01); *H01L 21/76826* (2013.01); *H01L 21/76834* (2013.01); *H01L 21/76843* (2013.01); *H01L 21/76877* (2013.01); *G01H 11/02* (2013.01)

(56) References Cited

U.S. PATENT DOCUMENTS

| | | | |
|---|---|---|---|
| 3,311,762 A | 3/1967 | Croitoru | |
| 3,603,822 A | 9/1971 | Petsinger | |
| 3,662,316 A * | 5/1972 | Robbins | G01S 13/0209 327/330 |
| 4,134,034 A | 1/1979 | Dardai et al. | |
| 4,846,066 A | 7/1989 | Beattie et al. | |
| 5,445,690 A | 8/1995 | Wulfman | |
| 6,625,399 B1 * | 9/2003 | Davis | G01J 1/4214 396/263 |
| 7,945,213 B2 * | 5/2011 | Sulkowski, Jr. | G01R 29/0814 340/3.43 |
| 8,217,537 B2 | 7/2012 | Bright | |
| 8,401,488 B2 * | 3/2013 | Sulkowski, Jr. | G01R 29/0814 342/445 |
| 9,400,768 B2 * | 7/2016 | Lundgren | H02K 44/08 |
| 2008/0156219 A1 * | 7/2008 | Voss | F41H 13/0025 102/402 |
| 2009/0224610 A1 * | 9/2009 | Fuks | F42B 12/36 307/108 |
| 2012/0032526 A1 | 2/2012 | Lundgren | |
| 2013/0262005 A1 * | 10/2013 | Lundgren | H02K 44/08 702/64 |

OTHER PUBLICATIONS

Kuhl, White & Kirkendall, Electromagnetic Waves from TNT Explosions, May 29, 2014, Scientific Research Publishing Inc.*
V. A. Gorelov et al, Experimental Invesitigation of the Parameters of Ionized Air Ahead of a Strong Shock Wave, 1971, orignal Russian and English translation.*
Agee, Baca, Dhama, lehr, Englert, Guadet, Shiffler, Vigil, Kaye. Experimental Studies of Explosively Driven Magnetohydrodynamic Generators. AFRL-DE-PS-TR-1998-1073.
Vigil Sandia National Laboratories. Explosively-Driven Magnetohydrodynamic (MHD) Generator Studies, Kirtland AFB, NM 87117-5000. SAND94-0045 Aug. 1994.

* cited by examiner

FIG. 1  HARBINGER WAVE FORMATION

MAGNETIC CAPTURE DEVICE (MCD)

M WAVE DYNAMIC PROPERTIES
EXTRACTION ALGORITHM

M SHOCK AND H WAVE EPICENTER ALGORITHM

FIG. 5 SIMULTANEITY OF MUNITIONS APPLICATION

PROTECTIVE ACTION AND
FIRST ALERT APPLICATIONS

METHODS, ALGORITHMS AND SIGNAL PROCESSING MEANS UTILIZING THE HARBINGER WAVE TO FORECAST AND SIGNAL AN IMMINENT SHOCK WAVE AND DETERMINATION OF ITS VELOCITIES, PRESSURES, DENSITY AND EPICENTER

TECHNICAL FIELD

The present specification relates to a Harbinger (H) wave method, algorithm and signal processing means that forecasts and signals an atmospheric explosive or impact/launch generated Main (M) shock wave and, more specifically, the determination of the emerging H wave velocity and trailing M wave's velocities, pressures, and density and further the location co-ordinates of the explosive, impact, or launch epicenter and the beneficial applications of these parameters. The present invention is based on the very creative but non-intuitive postulate that an external magnetic field will perturb an electromagnetic pulse thereby capturing it for use in several beneficial applications.

BACKGROUND

Presently an explosive detonation, projectile impact or launch generates an M shock wave that is not detected until heard, felt, or sensed with electrical pressure or acoustic devices; which, even in the case of the electrical sensing devices, is a late time annunciation of the event; that is, after the application of the shock or launched projectile's destructive effects on humans or equipment. This invention utilizes the discovery of a direct current (DC) electromagnetic pulse (EMP) called a Harbinger (H) wave. The EMP spectrum spans DC to light waves, thus an emerging shock M wave from an explosive blast, projectile impact or launch event emits a DC ionized mass slug upon formation, that is, ionization is broadcast from shock formation. The mass slug is a part of the Newton reaction component from the action of shock formation and analogous to a gun fired from a moving object in the same direction as the velocity vector of the moving object. The velocity of the bullet is the muzzle velocity plus the velocity of the moving object. In the Harbinger wave case the shock formation event fires an ionized mass slug at its velocity giving the H wave mass slug an initial velocity of two times the velocity of the emerging shock M wave.

For an explosive generated M shock wave, formation is at the outer edge of the visible fireball prorogating outward from the detonation point. Impact shocks from projectiles striking a target are formed at the center of impact. A projectile's accompanying launch device forms a shock at exit from a launch device such as a gun. They all emerge as a singular shock event propagating outward from their source and all are led by the H precursor wave.

The M wave emerging shock traveling behind the H wave is a quantum event led by a discontinuity which is a rapid rise from one state of environmental conditions of pressure, temperature, density, velocity and conductivity to yet another higher state. The thickness is expressed in Mean Free Paths or the average distance traveled by a moving particle such as an atom or molecule between successive collisions and, due to Heisenberg's Uncertainty Theorem, not a directly measurable quantity. This discontinuity led M shock wave is frequently applied to various applications such as military weapons. For example, a shock applied to the human body will rupture ear drums, collapse chest cavities and destroy brain cells or otherwise re-arrange the neurons. Mechanical and electrical equipment is especially sensitive to a shock and results in cessation of the equipment's mission. Shields to prevent mechanical or biological damage typically comprise robust and massive deflectors or gas operated protection such as air bags. To effectively deploy these devices a priori knowledge of the event is required as for example active protection such as back-blasts, to null the effect of an incoming shock wave, must be detonated within several microseconds of the shock arrival. Further the origin of sniper fire, explosive detonations, or projectile impact takes hours or days to determine. In the methods described herein annunciation of detrimental shock formation is in real time.

In addition to taking protective action on a potentially damaging explosive/impact/launch shock event, it is desirable to intentionally generate a DC EMP H wave for detection by other explosive hardware for the purpose of simultaneity of detonation to achieve energy focusing. The H wave is also suitable as a first alert annunciator which when received by a magnetic capture device will signal police, fire and military command centers that a destructive event has transpired and in this application is ideally suited for munition damage assessment. Further when a shock is formed and the H wave is created, there are now two waves, one the M shock wave created during blast, impact, or launch and the second is the newly discovered H wave that is the result of the action of M shock wave formation. Sensing the speeds and the difference in arrival of the two waves, the radial distance to the source is determined. Placing additional sensors at a different locations allows triangulation to the source of the M shock event; similar to seismic stations triangulation to an earthquake's epicenter.

Current art to locate a sniper attack (launch location) or determine the source location of an explosive detonation or projectile impact utilize man in the loop investigations. For instance a bullet entrance and exit from a target is analyzed to determine the trajectory and estimate velocity. The source is then determined by back geometrical calculations to the epicenter. Further the location of an explosive detonation is determined by analyzing the debris field or the painstaking analysis of several cameras, frame by frame. The current art for simultaneity of munitions requires that all munitions be connected together electrically to receive at best a microsecond jitter (the uncertainty of absolute timing) detonation signal. Utilization of the Harbinger wave removes the electrical connections and their associated costs and complexities, replaces the electrical hardware of each array element with a <$100 magnetic capture device, and yields jitters an order of magnitude or more less.

Accordingly, a need exists for a H/M wave algorithm and signal processing means to forecast an explosive, projectile impact or weapon launch generated shock wave, its dynamic variables of velocity, overpressure, dynamic pressure, density, and the location of the event. The information allows protection to be deployed such as back blasts that null the deleterious effects of a shock M wave, initial assessment of the event damage, and further determination of the co-ordinates of the source (detonation, impact or launch) location for immediate response. In this manner response teams, both military and civilian police forces, can locate events within seconds and form the appropriate actions.

SUMMARY

In the preferred process embodiment, a magnetic capture device will intercept the Harbinger (H) wave mass and Main (M) shock wave mass entering a slit in a magnetic capture device. The wave masses will interact with magnetically stored electromagnetic energy and their kinetic energy will transform to electrical energy which is picked up by a recording device such as a high input impedance (10 megohm to 100 megohm) oscilloscope, thereby producing an open circuit output voltage pulse. A signal processing algorithm is applied to extract the H and M velocity information and M wave shock properties and further utilizes the information to devise beneficial methods and systems such as human and equipment protection deployment, simultaneity of munitions, and first alert.

BRIEF DESCRIPTION OF DRAWINGS

The embodiment set forth in the drawings are illustrative and exemplary in nature and not intended to limit the subject matter defined by the claims. The following brief description of the illustrative embodiments can be understood when read in conjunction with the following drawings.

DETAILED DESCRIPTION OF DRAWINGS

Figure 1:
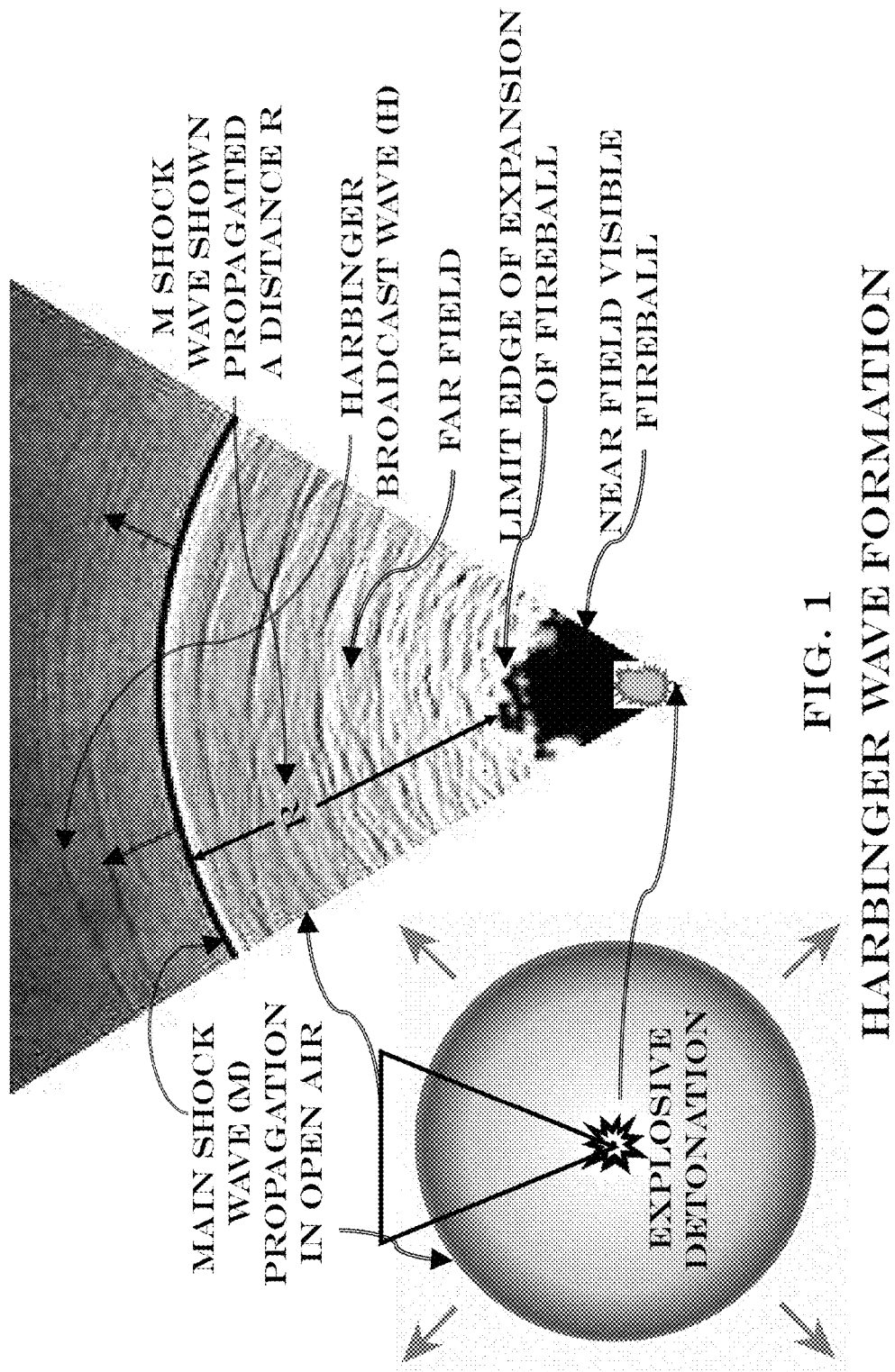
FIG. 1 schematically depicts the formation of the discovered H wave.

FIG. 1 depicts the formation of the Harbinger H wave from the Main M shock wave. An explosive detonation to produce a train of impulses of different amplitude pressure, and velocity is shown. As the chemical reaction progresses within the visible fireball the slower pulses of lower pressure amplitudes are overtaken by the faster pulses of higher pressure amplitudes and constructively interact forming one major event called an M shock wave which is formed at the limit edge of the fireball and propagates in the open-air media. As it propagates a distance R down range from the fireball it consumes the material in front of it forming a mass that is drug behind it. The mass is shown in FIG. 1 as the dark bold line of the M shock wave. This propagation of an explosive event shown on the drawing occurs outside the visible fireball, called the far field, witnessed in the detonation of explosives. Inside the fireball is called the visible near field of an explosive event and its radius of propagation is limited. It is chaotic and defined by many impulses spaced in time with different pressure amplitudes, velocities and durations. At the limit edge of expansion of the fireball when the M shock wave is formed it broadcasts the H wave mass at its velocity. This H wave shown on the drawing is not a shock, rather a DC ionized mass slug propagating front emitted upon formation of the M shock wave, that is, ionization is broadcast due to shock formation. The creation of the H wave in this manner also applies to impact and launch generated shocks as they follow Newton's laws of action-reaction.

The broadcasted H wave is a part of the Newton reaction component from the action of M shock formation. Various embodiments of the H wave formation, as well as methods, algorithms and signal processing means utilizing the H wave to forecast and signal an imminent M shock wave, in conjunction with the M wave determine the M wave epicenter, intentionally generate an H wave to effect simultaneity of munitions and focus energy, and determination of H wave velocity and M shock wave velocities, pressures, and density will be described in more detail herein.

Figure 2:
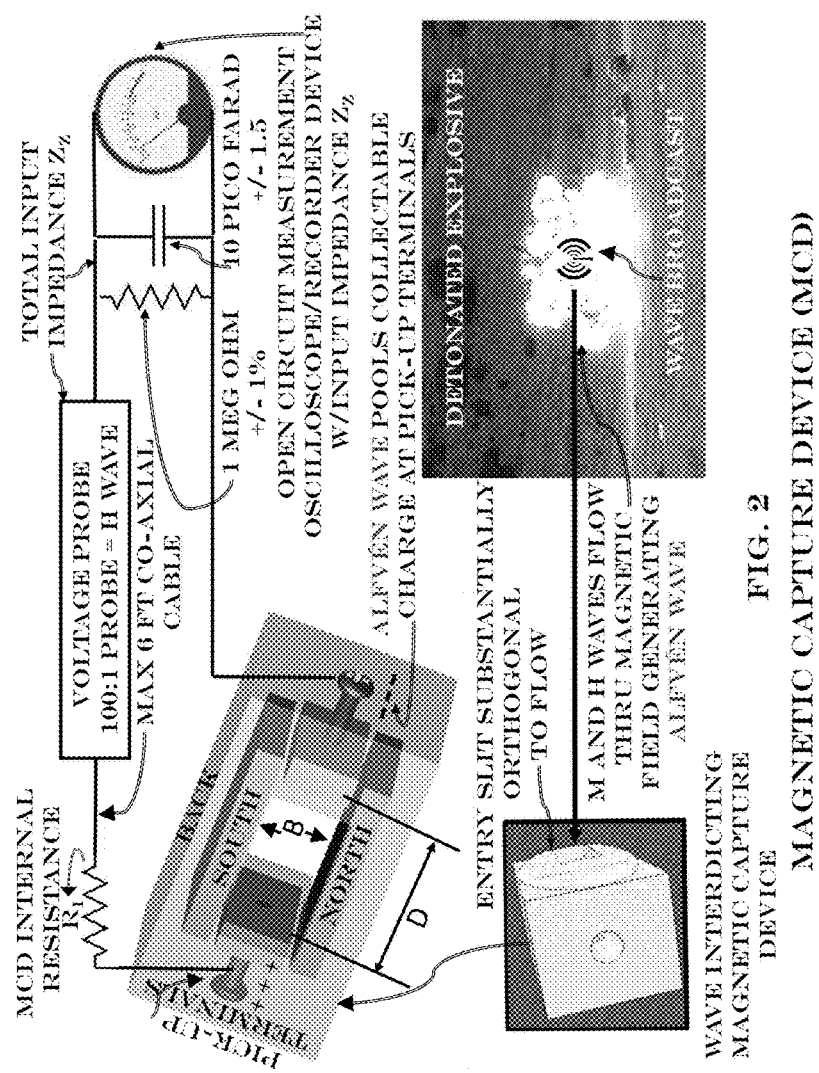
FIG. 2 schematically depicts a perspective view of the magnetic capture device and process application of the measuring technique for capturing the H wave mass open circuit voltage signal.

FIG. 2 depicts an H wave magnetic capture device process in which the M wave mass will also be captured by the MCD. This process consists of utilizing an MCD that consists of a plastic holder forming a substantially constant area channel analogous to a light entry slit, permanent magnets with North Pole facing South Pole to create a constant magnetic flux field (B) within the confines of the channel and orthogonal conductive pick up terminals separated by a distance (D) to complete the electrical circuit as the H wave mass generated by an explosive detonation enters the slit and passes through the magnetic field while simultaneously touching these pickup terminals. The masses, 1) the mass drug behind the M shock wave during propagation outward and 2) the DC ionized H wave mass launched at the time of M shock wave formation, are considered fluids with electrical properties of magnetic permeability and electrical conductivity. As the M and H wave masses are non-magnetic their permeability is $\mu_o$ and a constant equal to $4\pi*10^{-7}$ henries per meter. The electrical fluid conductivity, which is equal to an internal resistance designated $R_1$ for the geometry, is within the magnetic capture device and not accessible. As the fluid masses transit the slit channel of FIG. 2 $R_1$ varies from kilohms for the M wave to megohms for the H wave. An oscilloscope/recorder which now sees an input impedance $Z_z$ thru a 100:1 voltage probe is connected to the output terminals of the magnetic capture device to measure the open circuit voltage of both M and H wave. In the limit the definition of an open circuit voltage measurement is a voltage measurement into an infinite impedance. In this quantum limit the measurement would require only one electron and $R_1$ could be neglected. Practically $R_1$ cannot be ignored as it is a significant portion of the standard input impedance of 1 Megohm in parallel with 10 Pico farad to an oscilloscope/recorder. To prevent the voltage from significantly dropping within the wave masses fluid and contaminating the output data signal two preventive measures are undertaken:

The length of the co-axial cable hook up to the voltage probe cable is kept to 6 feet or less to prevent signal current generated by the H and M waves from capacitively coupling to ground and dragging a reactive component of current thru $R_1$ dropping voltage in the M and H wave fluid masses rather than the oscilloscope/recorder input impedance circuitry thereby contaminating the open circuit voltage measurement.

To prevent the $R_1$ value from becoming a significant percentage of the total input resistance of the oscilloscope/recorder circuit, thereby again contaminating the open circuit measurement by dropping a significant portion of the voltage within the M and H wave fluid masses, a high impedance probe is connected to the input of the oscilloscope/recorder. This standard oscilloscope probe effectively increases the input impedance by 100 the industry standard 1 Megohm with 10 Pico farad capacitor meter/recorder input impedance. Several variations of the standard oscilloscope probe are available and can be used in the process however, the input impedance must be substantially 100 Megohm to prevent contamination.

Figure 3:
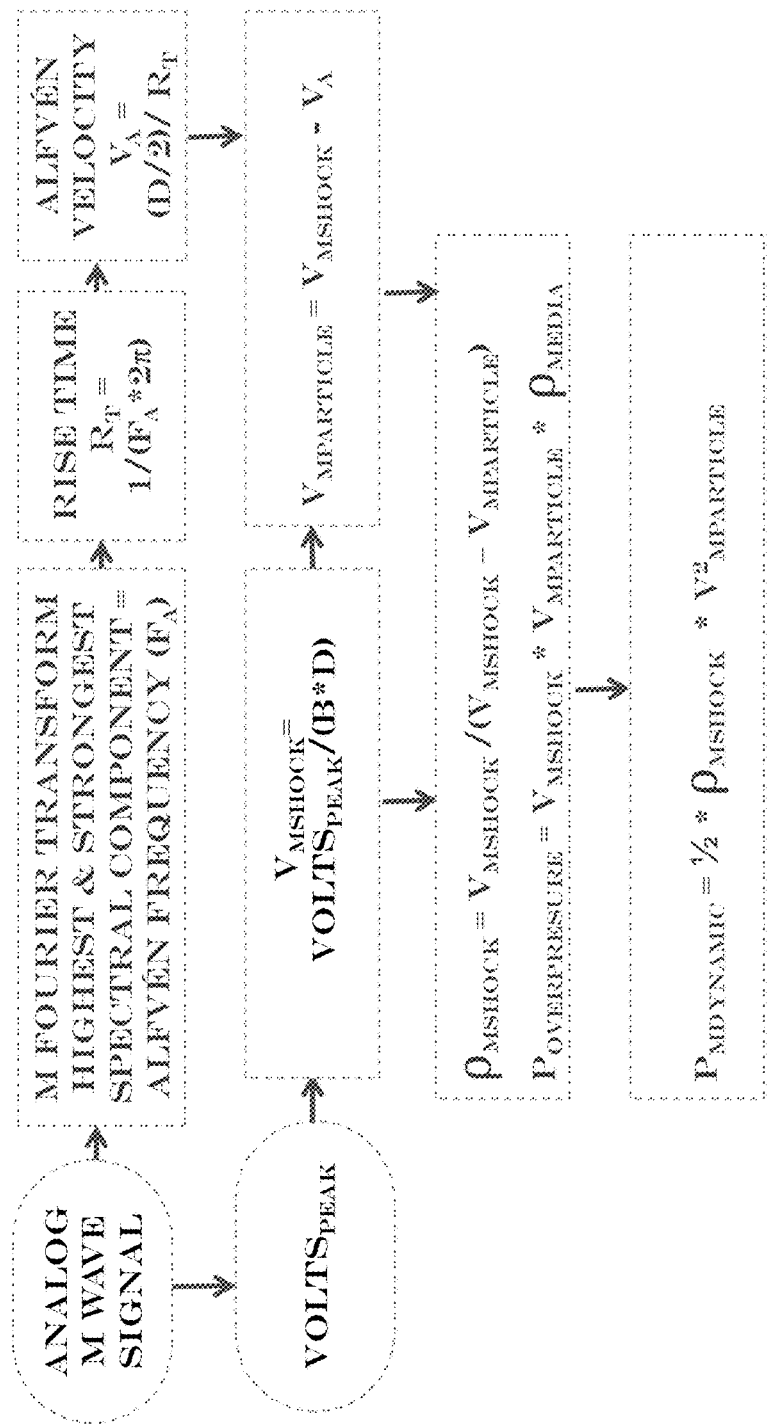
FIG. 3 schematically depicts the algorithmic and signal processing method to extract the M shock dynamic properties.

FIG. 3 depicts the M wave dynamic properties extraction algorithm. In the M shock wave there are two velocities one called the shock velocity, the other the particle (fluid) velocity. The shock velocity is the velocity measured by the magnetic capture device and is the summation of the particle velocity plus the Alfvén wave velocity. The Alfvén wave velocity is the charge transport mechanism that pools electrons on one pickup terminal and ions on the other. It is generated when the M wave fluid mass plucks the strings of the magnetic B field. Shock velocity is analogous to a runner on the deck of a ship running with the ship's movement. The runner's total velocity is the runner's velocity plus the ship's velocity.

First a Fourier transform of the M wave signal (top line of algorithm) is taken and the highest and strongest spectral component is identified, which is the Alfvén frequency $F_A$ generated by the M shock discontinuity front. The purpose of this identification is to compute the Alfvén wave velocity by first computing the Alfvén rise time $R_T$ by taking the inverse of $2\pi*F_A$ and then dividing the result into D/2, the midpoint of the channel, to produce the Alfvén wave velocity $V_A$ which is the speed at which electrons are pooled at one pickup terminal and ions on the opposite terminal. Secondly the shock velocity of the M shock wave and the particle velocity of the H wave are computed in the second line of the algorithm. To obtain the M wave particle velocity $V_A$ is subtracted from the computed $V_{MSCHOCK}$ to yield $V_{MPARTICLE}$.

Velocities identified, Newton's laws are applied in the final two lines to produce the M shock wave density, $\rho_{MSHOCK}$, of the mass the M shock wave drags behind it, and its overpressure, $P_{OVERPRESSURE}$, and dynamic pressure, $P_{MDYNAMIC}$.

Figure 4:
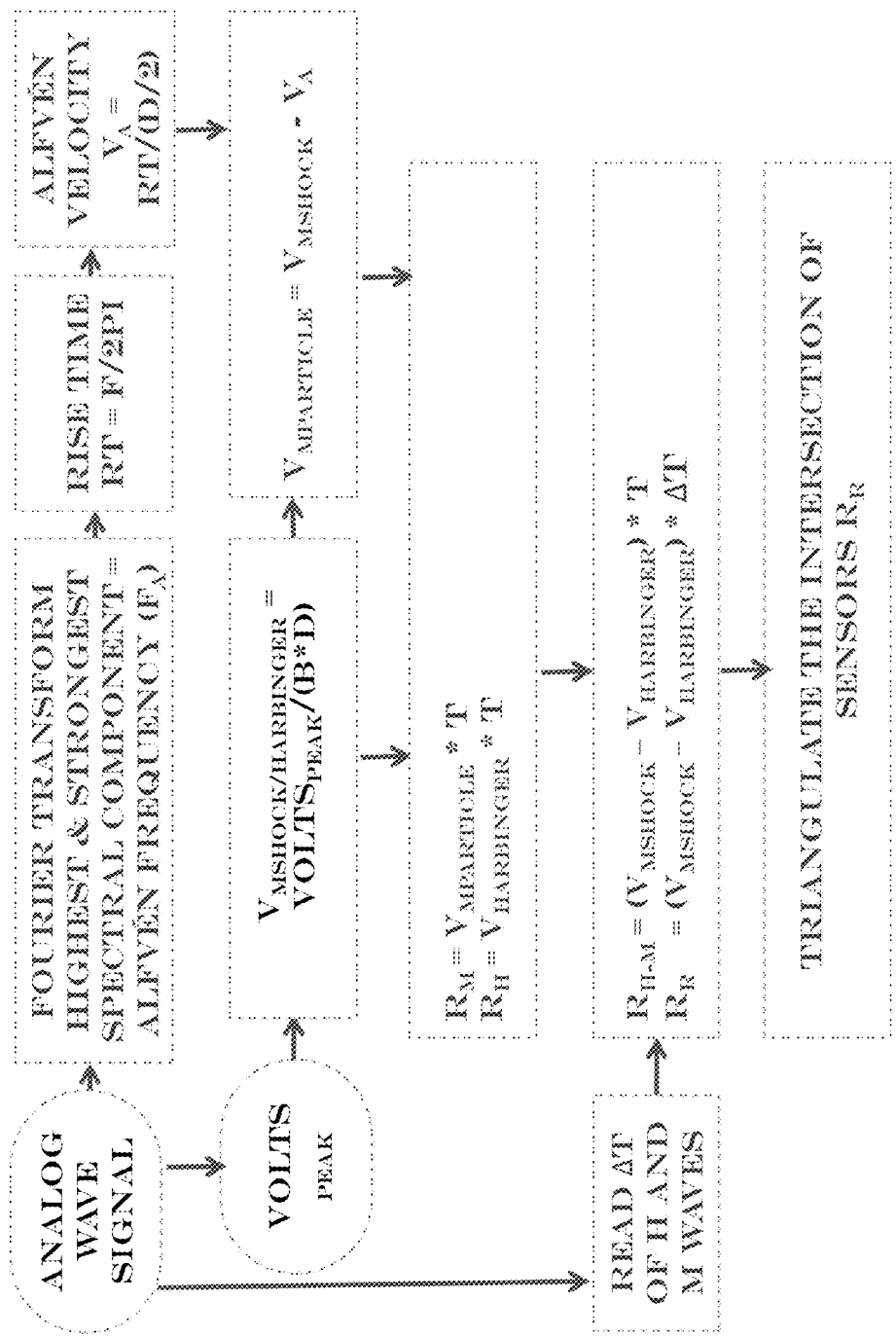
FIG. 4 schematically depicts the algorithmic and signal processing method to locate the source co-ordinates of the shock event epicenter.

FIG. 4 depicts the use of the H and M waves to determine the co-ordinates of the epicenter of an M shock wave event. As in FIG. 3 the first two lines of the algorithm identify the particle velocities of each wave for each sensor. The radial distance equations are then set up in line 3. $R_M$ and $R_H$ are the radial distances to the shock formation and T is the elapsed time. In the 4th line the equations of line 3 are differenced and the delta time ($\Delta T$) between wave arrivals at a sensor read from the analog wave signal. The radial distance $R_R$ of a sensor from the shock wave formation is then computed in line 4. Finally the intersection of all of the sensors $R_R$ are plotted to reveal the epicenter.

Figure 5:
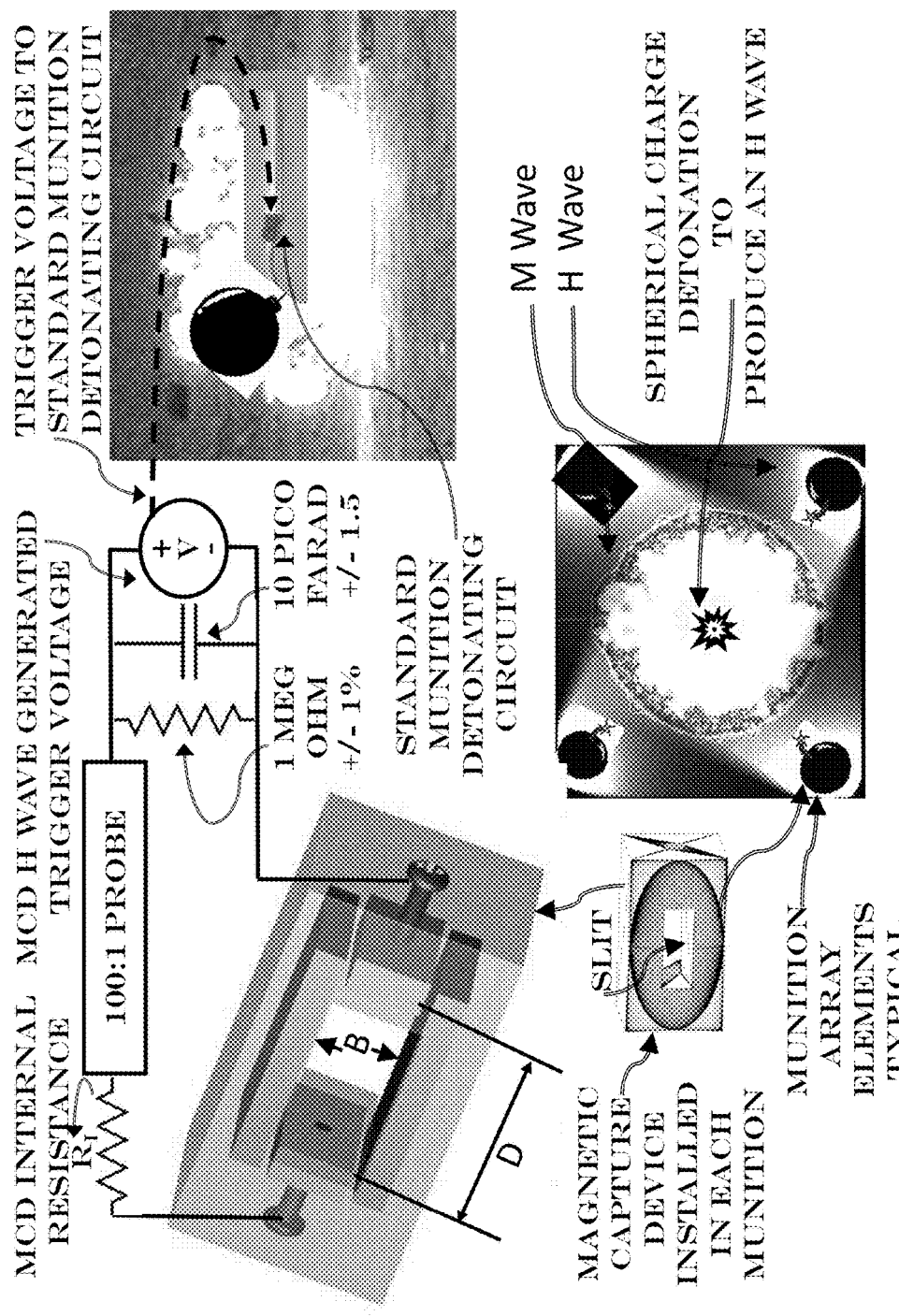
FIG. 5 schematically depicts the intentional generation of a DC EMP H wave pulse to obtain simultaneity of munitions for the purpose of energy focusing.

FIG. 5 depicts the intentional generation of an H wave to obtain simultaneity of munitions' application for the purposes of energy focusing. As shown in the figure an explosive H wave generating spherical charge is placed equidistant from each element of an array of munitions and detonated to produce an H wave. Attached to each munition is the magnetic capture device of FIG. 2. The magnetic capture device, which is connected thru a 100:1 probe and 1 Megohm in parallel with 10 Pico farad and which generates a voltage V, is electrically tied to the standard detonation fuze circuit of the munition. When the H wave arrives it detonates the array of munitions at the same time.

Figure 6:
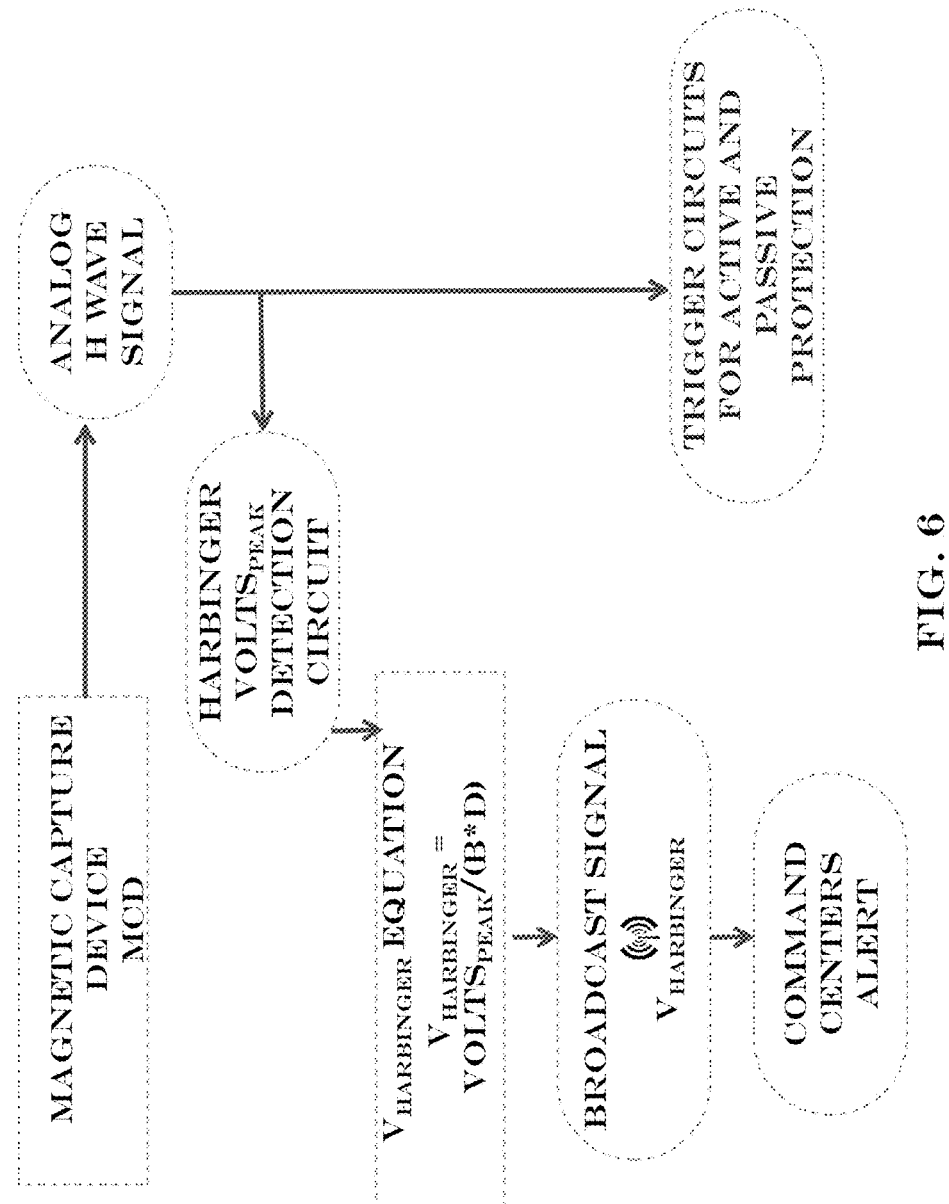
FIG. 6 schematically depicts the Harbinger wave applied to first alert and shock wave protective device applications.

FIG. 6 depicts the Harbinger wave use as a first alert process and M shock wave active and passive protection trigger. The H wave is first captured by the FIG. 2 magnetic capture device which produces via generation of an Alfvén wave an analog H wave signal. This signal is sent through an electrical Volts$_{peak}$ detection circuit, digitized and converted to the Harbinger velocity by the $V_{harbinger}$ Equation. This signal is then broadcast to police, fire and military command centers annunciating that a destructive event has transpired, and by standard relations of wave velocities versus mass of the explosive generating these velocities, the energy contained in the event. In the case of shock wave protection and countermeasures the analog H wave signal is tied directly to the trigger circuits for actuation of protective devices such as shields, airbags, or back blasts.

What is claimed is:

1. A Harbinger (H) wave capture process, algorithm, and signal processing method utilizing high input impedance circuitry to generate an Open Circuit Wave Voltage signal, said method comprising the steps of:

Interdicting the formed Harbinger (H) wave mass that is formed within a Main (M) shock wave itself created from a detonated explosive by placing a Magnetic Capture Device, consisting of a rigid holder containing permanent magnets and pick-up terminals that forms a substantially constant area rectangular channel with the permanent magnet North Pole facing its South Pole to create a length (L) of constant magnetic flux (B) within the confines of the channel and orthogonal conductive pick up terminals separated by a width (D), Placing the Magnetic Capture Device into the M wave and H wave mass flow and substantially orthogonal to the flows thereby directing the flows into the rectangular channel of the Magnetic Capture Device thus sampling a small portion of the flows by passing the flows thru the magnetic flux (B) to generate an Alfvén wave to pool negative (−) charged electrons on one pickup terminal and positive (+) ions on the opposite terminal thereby generating an analog Open Circuit Wave Voltage;

Placing a 100 to 1 voltage probe within 6 feet of the pick-up terminals of the Magnetic Capture Device and the output of the probe to an oscilloscope/recorder or other voltage measuring device with 1 megohm in parallel with 10 picofarad capacitor input impedance included therein and setting the oscilloscope/recorder or other voltage measuring device to record and store at a minimum of 1 MHz frequency resolution for the purposes of detecting and measuring the Alfvén wave within an Open Circuit Wave Voltage signal that is generated by the H wave mass during transit thru the magnetic flux (B).

2. The method of claim 1 for purposely generating an H wave mass and thereby an Open Circuit Wave Voltage signal electrical trigger to simultaneously trigger an array of munitions for the purpose of focusing the munition array output energy, said method comprising the steps of:

Purposely generating an H wave mass by placing an explosive sphere equidistant from an array of munitions and detonating the explosive sphere;

Interdicting the formed H wave mass by placing a Magnetic Capture Device into each array munition and exposing it substantially orthogonal to the generated H wave mass flow thereby directing the H wave mass thru the magnetic flux B generating an Alfvén wave to pool collectable negative (−) electron charge on one pickup terminal and positive (+) ionic charge on the opposite terminal;

Placing a 100 to 1 voltage probe directly to the pick-up terminals of each Magnetic Capture Device and the probe to a 1 Megohm and 10 Pico farad voltage sensing load whereby a trigger voltage V is established;

Directly connecting the established trigger voltage output V to the standard munition detonating circuit for the purpose of triggering munition detonation upon receipt of the H wave mass trigger voltage V, thereby simultaneously detonating the array of munitions.

3. The method of claim 2 for capturing an H wave mass and for generating an Open Circuit Wave Voltage signal from any explosive charge detonation and establishing an H wave mass signal voltage V from a received H wave mass for the purposes of alerting command centers that a destructive event has transpired and triggering Main (M) shock wave protective devices, said method comprising the steps of:

Capturing the H wave mass with a Magnetic Capture Device thereby establishing an H wave mass signal voltage V;

Applying a Peak Voltage electrical detection circuit to the generated H wave mass signal voltage V and digitizing the resulting Peak Voltage and converting it to engineering units of velocity (v) with the equation v=Peak Voltage/(B*D);

Broadcasting the velocity (v) information wirelessly to command and alert centers for the purpose of annunciation that a destructive event has transpired and determination of how large it is by applying the standard physical relations of velocity (v) versus shock magnitude;

Directly connecting the H wave mass signal voltage V to the electrical trigger circuits of active and passive protective devices for the purpose of actuation of those protective devices.

\* \* \* \* \*